Figure 2:
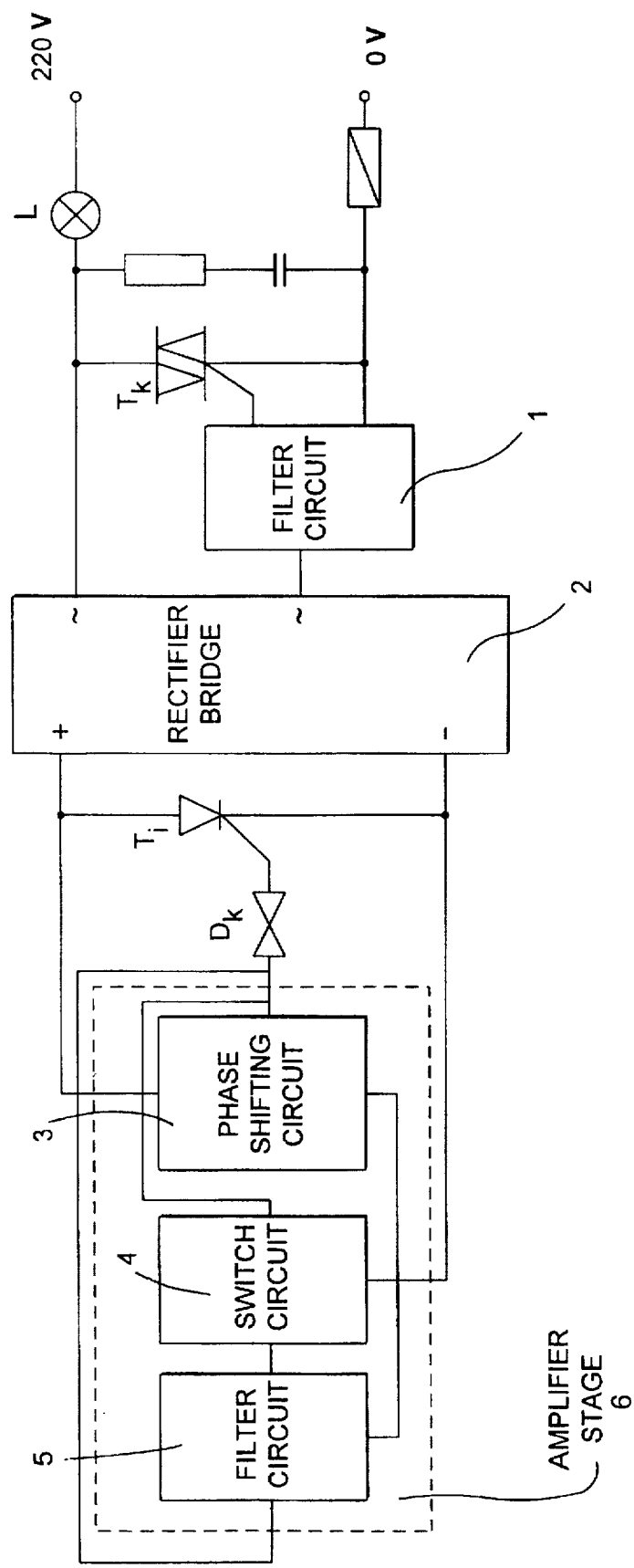

United States Patent [19]

Fazakas

[11] Patent Number: 5,783,876
[45] Date of Patent: Jul. 21, 1998

[54] SWITCH WITH CONTROLLED RISE AND FALL CHARACTERISTICS

[76] Inventor: András Fazakas, Alvinci u. 30. I/1., Budapest, Hungary, H-1022

[21] Appl. No.: 737,268

[22] PCT Filed: Apr. 28, 1995

[86] PCT No.: PCT/HU95/00012

§ 371 Date: Jan. 13, 1997

§ 102(e) Date: Jan. 13, 1997

[87] PCT Pub. No.: WO95/31040

PCT Pub. Date: Nov. 16, 1995

[30] Foreign Application Priority Data

May 6, 1994 [HU] Hungary ................... P9401459
Dec. 20, 1994 [HU] Hungary ................... P9401459
Apr. 13, 1995 [HU] Hungary ................... P9401459

[51] Int. Cl.$^6$ ......................................... H01H 9/30
[52] U.S. Cl. ................. 307/135; 307/112; 307/125; 307/127; 307/139
[58] Field of Search .............................. 307/112, 116, 307/125, 126, 127, 130, 131, 134, 135, 139, 140

[56] References Cited

U.S. PATENT DOCUMENTS

| | | | |
|---|---|---|---|
| 4,366,426 | 12/1982 | Turlej | 310/786 |
| 4,950,963 | 8/1990 | Sievers | 315/360 |
| 5,539,284 | 7/1996 | Stone | 315/360 |
| 5,606,225 | 2/1997 | Hua | 315/121 |

*Primary Examiner*—William M. Shoop, Jr.
*Assistant Examiner*—Jonathan Kaplan
*Attorney, Agent, or Firm*—Ladas & Parry

[57] ABSTRACT

A switch having controlled rise and fall characteristics for electronic switching and power controlling a load has a switching element for the load controlled by a rectifier bridge, a filter circuit, a feedback amplifier stage, a low-power switch (SCR) and a diac. The feedback amplifier stage has a phase shifting circuit, a switching and/or amplifying circuit and a filter stage. The filter stage has a capacitor, Zener diode, a switch and, possibly, a potentiometer for controlling rise-control and fall-control resistors.

2 Claims, 3 Drawing Sheets

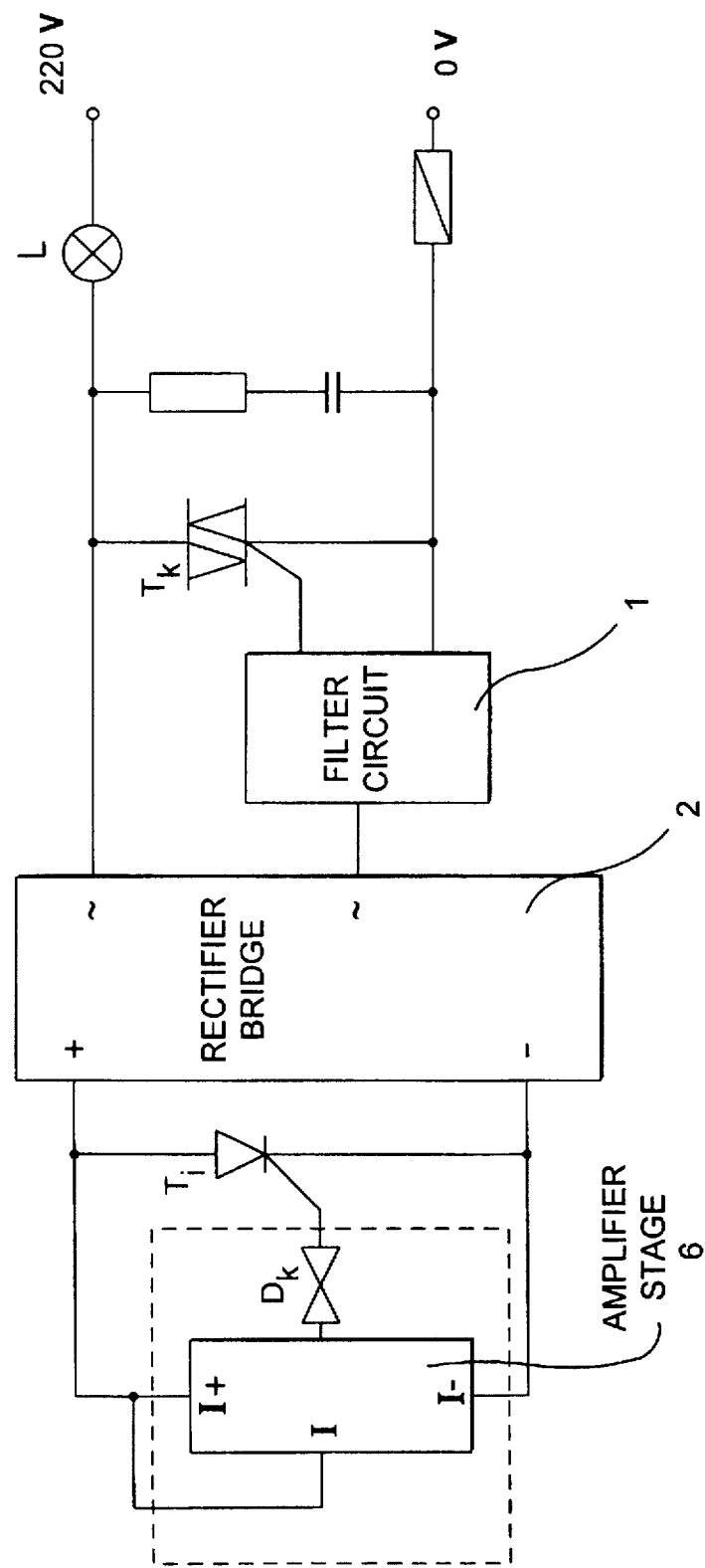
F I G. 1

SWITCH WITH CONTROLLED RISE AND FALL CHARACTERISTICS

This invention relates to a switch with controlled rise and fall characteristics and power controller with controlled rise and fall characteristics the mentioned power controller comprising a triac or SCR (silicon controlled rectifier) switching element connected in series to the load, a control circuit connected to the gate and the power electrode of the aforementioned switching element.

There are known some certain electronic switching circuits with controlled rise and fall characteristics. Some known circuits are described in the book: Király A., Elektronikai receptek I. (Electronic recepies I. Müszaki Kiadó, Budapest). Such circuits developed for AC applications are well suited for applications belonging to the illumination techniques, where they are used in order to increase the lifetime of luminous body, to avoid sudden changes in illumination, to switch on or off the luminous body in a programmed or in a sensor controlled manner, to limit and control the luminous intensity or energy consumption controlling either manually or automatically the operation of other electrical loads like electrical heating appliances and motors.

A power controller having a relatively simple construction is described in the afore mentioned reference on page 34.

The power over an ohmic or inductive load is controlled via controlling the initial phase of the triac switching element, the necessary phase-shifting is created by a phase-shifting chain of serial RC-elements. The first resistor of the phase-shifting chain is fed by the AC mains, changing the resistance of the resistor the phase-shift of the current going through triac also varies. The impulse suitable for controlling the triac is formed by a diac connected in series with the lead coming from the gate of the triac.

A disadvantage of the known circuit is that it is unsuitable for achieving controlled rise and fall characteristics, it is suitable only for setting the power to a fixed value.

A circuit suitable slowly increasing the luminous intensity in an automated manner is given on page 70 of the afore mentioned reference. The controlling part of the circuit composed of a relatively big number of elements, such as transistors and integrated circuits, is fed from mains powersupply. A drawback of the solution is that it cannot be implemented in small size due to the presence of the transformer in the mains powersupply.

A switch with controlled rise and fall characteristics is presented on pages 73-75 of the referenced book. The triac of the switch is controlled via optoelectronic coupling between the LED of the control circuit and the photoresistor situated in the gate circuit. Also in this case the control circuit is supplemented with mains supply composing a transformer.

A time responsive switching circuit for use with a single phase alternating current motor comprising a triac in series with a start winding of the motor was disclosed in U.S. Pat. No. 4,366,426. In this circuitry the triac is used in the AC side of an diode bridge, and a low voltage SCR element is used in the control stage, at the DC side of said bridge. However this circuitry is constructed for driving an inductive start winding and not for turning on general loads, for instance incandescent lamps.

The known switches with controlled rise and fall characteristics, due to their relatively big space requirements and power consumption, are not suitable for being placed into hidden locations having bad cooling circumstances.

This is an object of the present invention to provide a switch with controlled rise and fall characteristics which effectively eliminates the disadvantages of the known solutions; the switch according to the invention does not require a separate power supply has small dimensions, and low heat dissipation, the switch according to the invention is suitable for use in a construction without a cooling surface formed in it, e.g. in the box of a sunk illumination switch on the wall together with the switch and power controlling potentiometer.

The invention is based on the idea that the feeding of the control circuit can be realised by the mains voltage appearing via the capacitive elements, which are necessary components of the circuit anyway, over the triac or SCR switching element, where the element serve also as attenuator.

According to the solution provided by the invention the switch and the power controller, both exhibiting controlled rise and fall characteristics are realised using triac or SCR switching element, which is connected in series with load, a rectifier bridge, one AC input of which is connected to a first power electrode of the switching element, and another AC input of which is connected through a filter circuit to a gate of the switching element. The switch further comprises a control circuit including an amplifier stage having a control input and positive and negative inputs being connected to the positive and negative DC outputs of the rectifier bridge respectively, and a feed-back is provided between the control input and the positive input. The switch further comprises a low power SCR arranged between the positive and negative DC outputs of the rectifier bridge and driven by the output of the control circuit, and the output of the amplifier stage is connected to the gate of the SCR directly through a diac.

The amplifier stage in its advantageous form comprises a phase shifting circuit, a switching and/or an amplifying circuit and a filter stage. The inputs of the phase shifting circuit are connected to the DC outputs of the rectifier bridge, the output of the phase shifting circuit corresponds to the output of the amplifier stage, a diac connected to the gate of the SCR with one of its connection terminals is connected to the output of the phase shifting circuit.

The output of the switching and/or amplifying circuit, which advantageously comprises transistors, is connected to the common point of the diac and the output of the phase shifting circuit, one of its inputs is connected to the negative DC output terminal of the rectifier bridge, while its other input is connected to he output of filter stage, which filter stage is advantageously constructed using passive elements. One of the inputs of the filter stage is connected to the negative DC output of the rectifier bridge, while the other input of the filter stage corresponds to the control input of amplifier stage.

If power control is not required, then in an advantageous arrangement the switch in the filter stage, comprising a capacitor, a resistors controlling the fall and rise characteristics and favourably Zener-diode, is placed in the following manner, one connection terminal of the capacitor and the anode of Zener-diode, connected in parallel with the mentioned capacitor, is connected to negative DC output of the rectifier bridge. The other connection terminal of the capacitor and the cathode of the Zener-diode connected in parallel with the mentioned capacitor is connected to the common point of the resistors controlling the fall and rise characteristics and which are connected in series, the other connection terminal of the fall-resistor is connected to a connection terminal of the switch. The other connection terminal of the switch corresponds to the input of the filter stage, while the other connection terminal of rise-resistor corresponds to the output of the filter stage.

In order to achieve power control effect it is advantageous to arrange the power-control potentiometer and switch of filter stage comprising a capacitor, fall- and rise-control resistors and a Zener-diode in the following manner; the capacitor end the switch and the anode of the Zener-diode are connected to the negative DC output of the rectifier bridge, the other connection terminal of the switch is connected to an and point of power control potentiometer, the sliding variable connection terminal of the potentiometer is connected to the other connection terminal of the capacitor and to rise-resistor.

The other connection terminal of the rise-control resistor corresponds to the output of the filter stage. The other end point of the potentiometer is connected to the cathode of Zener-diode and to the fall-control resistor, furthermore the other connection terminal of the fall-control resistor corresponds to the input of the filter stage.

In its advantageous arrangement the switch is at least partially implemented as an integrated circuit.

An advantage of the arrangement according to the invention over the known arrangements is that loss power of control circuit can be cut down to 0.5 W, there is no need for power supply, and this is why can be realised in small rise, and can be placed into closed places with no ventilation, for example can be placed into a wall sunk switch-box.

In the following the invention is presented as example of advantageous embodiment, referring to FIGS. 1-4.

In FIG. 1 the schematic circuit diagram of a switch with controlled rise and fall characteristics that is suitable for power control is shown.

In FIG. 2 a detailed block-diagram of the amplifier of grade a switch to mentioned characteristics is shown.

Figure 4:
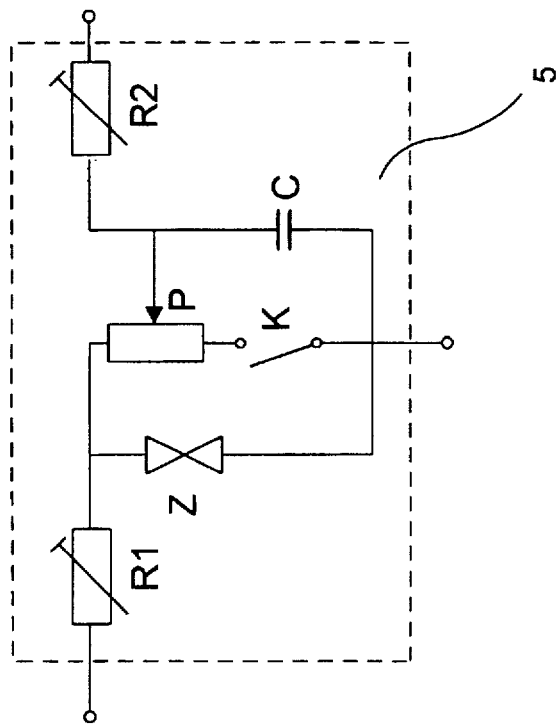
Figure 3:
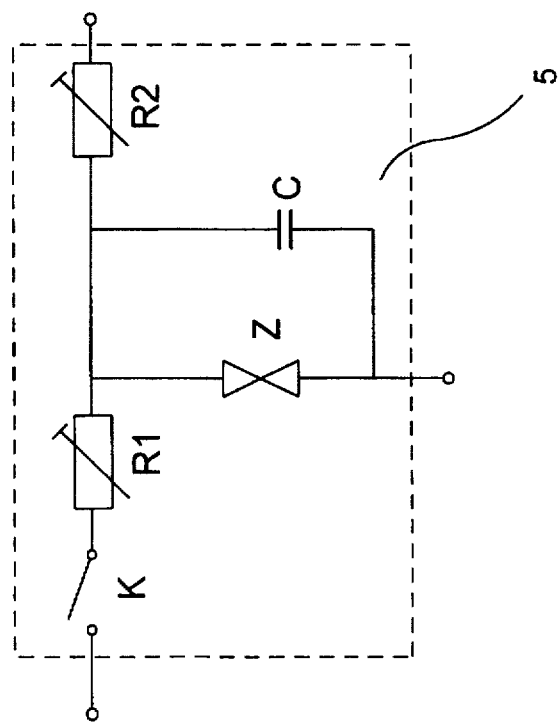

In FIGS. 3 and 4 a possible advantageous arrangement of the filter stage is illustrated.

The arrangement shown on the Figures is described below.

In FIG. 1, the switching element of the controlled electronic, AC mains switch is shown, which switching element is a triac Tk, this triac Tk is connected in series with the load L to be controlled—such as a filament lamp, or the divided pole induction motor, capacitance motor or universal motor of a ventilator, kitchen machine, vacuum cleaner, or drill—the power circuit of the triac Tk is surrounded with the usual protective and noise suppression elements, which are not described here in detail since they are wellknown. The gate electrode of the triac Tk is connected via the filter circuit 1 to one of the AC inputs of the rectifier bridge 2. The common point of the load L and the triac Tk is connected to the other AC input of the rectifier bridge 2 in the control circuit. The DC outputs of the rectifier bridge 2, indicated at + and −, serve as power supply for the control circuits, where the rectified, and attenuated mains signal is present, furthermore a low power SCR is connected between the mentioned DC outputs, which SCR Ti short-circuits the DC outputs depending on its electronic control, and provides gating pulses for the triac Tk in each half-period of the supply network.

No extra forming step is needed for the trigger signals of the triac Tk, since the SCR Ti provides appropriate gating signals through the rectifier bridge 2. For this reason it is not necessary to use e.g., a diac in the gate circuit of the triac Tk. On the other hand, in the gate circuit of the low power SCR Ti a diac is connected serially, to ensure the error-free opening of the SCR Ti, bringing that into conducting state. The gate of the SCR Ti is connected via diac Dk to the output of amplifier stage 6. The output of the amplifier stage 6 is fed back to its control input I. Indirect feed-back via a resistive element can also be possible. The amplifier stage 6 comprises a switch K, which is advantageously connected in series with the control input of the amplifier stage 6. FIG. 2 illustrates circuit block diagram of the amplifier stage 6. The amplifier stage 6 comprises a phase-shifting circuit 3, a switching and/or amplifying circuit 4, and a filter stage 5. The inputs of the phase shifting circuit 3 is connected between the DC outputs of the rectifier bridge in the amplifier stage 6, the output of the phase shifting circuit 3 corresponds to the output of the amplifier stage 6 a diac Dk, connected with one of its connection terminals to the gate of the SCR Ti, is connected with its other connection terminal to the mentioned output of the phase shifting circuit 3, which, as has also been mentioned, corresponds to the output of the amplifier stage 6. This output of the switching and/or amplifying circuit 4, which circuit is advantageously built using transistors, is connected to the common point of the diac Dk and the output of the phase shifting circuit 3, one of the two inputs of the mentioned switching and/or amplifying circuit 4 is connected to the negative DC output (−) of the rectifier bridge 2, the other input is connected to the output of a filter stage 5, advantageously built of passive components. One of the inputs of the filter stage 5 corresponds to the control input I of the amplifier stage 6, while the other input of the filter stage 5 is connected to the negative DC output (−) of the rectifier bridge 2.

In FIG. 3, a possible arrangement of the filter stage 5 is shown for the case when no power-control is required. The filter stage 5 comprising a capacitor C, a fall-control resistor R1 and a rise-control resistor R2, and advantageously a Zener-diode Z, has a switch K arranged in the following manner. One of the two connection terminals of the capacitor C and the anode of the Zener-diode Z connected in parallel with the capacitor C, are connected to the negative DC output (−) of the rectifier bridge 2. The other connection terminal of the capacitor C and the cathode of the Zener-diode Z connected in parallel with the capacitor C are connected to the common point of the fall-control resistor R1 and the rise-control resistor R2, where fall-control resistor R1 and rise-control resistor R2 are connected in series. The other connection terminal of fall-control resistor R1 is connected to one of the two connection terminals of the switch K. The other connection terminal of K corresponds to the input of the filter stage 5, while the other connection terminal of the rise-control resistor R2 corresponds to he output of the mentioned filter stage 5.

In FIG. 4, a possible arrangement of the filter stage 5 is given for the case when power-control is required. The filter stage 5 comprising a capacitor C, a fall-control resistor R1 and a rise-control resistor R2, and advantageously a Zener-diode Z, has a power control potentiometer P and a switch K arranged in the following manner, a connection terminal of the switch K together with the anode of the Zener-diode Z is connected to the negative DC output of rectifier bridge 2. The other connection terminal of the switch K is connected to an end point of the power control potentiometer P, the middle terminal of the power control potentiometer P is connected to the other connection terminal of the capacitor C and to a connection terminal of the rise-control resistor R2. The other connection terminal of the rise-control resistor R2 corresponds to the output of the filter stage 5. The other end of the power control potentiometer P is connected to the cathode of the Zener-diode Z and to a connection terminal of the fall-control resistor R1.

The other connection terminal of the fall-control resistor R1 corresponds to the input of the filter stage 5, the switch with controlled rise and fall characteristics can be implemented as a hybrid or partially monolithic IC.

The operation of the switch with controlled rise and fall characteristics according to the invention is described below.

The amplifier stage 6 of FIG. 1 comprises phase shifting circuit, amplifier and filter circuits, which circuits can be built of off-the-shelf components. The arrangement of the amplifier stage 6 is detailed in FIG. 2.

If in the amplifier stage 6 the switch K is connected in serial with the input, that is the arrangement according to FIG. 3 is used for the filter stage 5 then the operation of the circuit is as follows. If the switch K is steadily connected, then the controlled switch, that is the triac Tk is in disconnected state. The reason for this situation is that, no current flows through the loal, since the capacitor C in the filter stage 5 is charged via resistor fall-control resistor R1 to the potential of the Zener-diode Zr and so, as a consequence, the voltage present at the input of the switching and/on amplifying circuit 4 is high enough to keep the potential at its output, which is connected to the phase shifting circuit 3, and to diac Dk, low enough to keep the SCR Ti—via diac Dk—in a disconnected state, that is, the SCR Ti will not be ignited and the triac Tk is steadily in a disconnected state.

If we open the switch K, then the charging current of the capacitor C is being stopped, but the discharging current keeps flowing through the rise-control resistor R2 and the switching and/or amplifying circuit 4. The potential of the capacitor C will decrease to such a low level after a certain time, which time depends on the value of the rise-control resistor R2, that the switching and/or amplifying circuit 4 disconnects, and bigger and bigger portions of the halfperiods of the rectified mains voltage appear at the output of the phase shifting circuit 3, that is impulses resulting increased flow angle appear, and the diac Dk ignites the SCR Ti. The SCR Ti after it has been fired connects the diagonal of the rectifier bridge 2, and so impulse, with energy coming from the supply in both halfperiods, appears the input of filter circuit 1 of the triac Tk, as a consequence, increasing current is flowing through the load L, till the triac Tk reaches the full on state. Varying the value of the resistor rise-control resistor R2 the switching time of the triac Tk can be controlled.

When we connect the switch K again (in order to disconnect the circuit of the load L) the switching and/or amplifier circuit 4 reaches the on state for longer and longer periods through the filter stage 5, as the voltage over the capacitor C increases via the fall-control resistor R1. AS a result, we disconnect the SCR Ti with the diac Dk in the following manner, the impulses starting the SCR Ti appears later and later in the consecutive mains halfperiods, and finally the impulses will totally disappear, in the latter case the triac Tk will not fe, and the circuit of the load L will reach a disconnected state. The time required to reach this disconnected state can be controlled with the rise-control resistor R2.

If the switch K of the filter stage 5 is in the arrangement according to FIG. 4, that is the switch K is connected in series with the power control P potentiometer the operation differs from the operation deserted afore in the following details, the input voltage of the switching and or amplifying circuit 4 can be set according to the position of the power control potentiometer P. This results in a certain flow-angle, which is constant in this manner it makes the control of the output power possible. Obviously, the rise and the fall will be continues also in this case, and the time required for the rise and the fall depends on the values of fall-control resistor R1 and rise-control resistor R2.

The rise and the fall of the switch has a logarithmic characteristics, which is apercipiated by the human eye—in the case of a light-source—as a linear rise and fall.

I claim:

1. A switch with controlled rise and fall characteristics for electronic switching and power controlling of a load (L), the switch comprising:

a triac or an SCR switching element (Tk) having a first power electrode for connection in series with a load (L), having a second power electrode and having a gate electrode;

a rectifier bridge (2) having a first AC input connected to the first power electrode of the switching element (Tk), having a second AC input and having positive and negative DC outputs (+, −);

a filter circuit (1) connecting the second AC input of the rectifier bridge (2) to the gate electrode of the switching element (Tk);

a feed-back amplifier stage (6) having an output;

a low-power SCR (Ti) having first and second electrodes respectively connected to the positive and negative DC outputs (+,−) of the rectifier bridge (2) and having a gate electrode; and a diac (Dk) connected between the output of the feed-back amplifier stage (6) and the gate electrode of the low-power SCR (Ti);

wherein the feedback amplifier stage (6) comprises a phase shifting circuit (3) having first and second inputs and an output, a switching and/or amplifying circuit (4) having first and second inputs and an output and a filter stage (5) having first and second inputs and an output, the first and second inputs of the phase shifting circuit (3) being respectively connected to the positive and negative DC outputs (+,−) of the rectifier bridge (2), the outputs of the phase shifting circuit (3) and the switching and/or amplifying circuit (4) being connected as the output of the amplifier stage (6), second and first inputs of the switching and/or amplifying circuit (4) being respectively connected to the negative DC output (−) of the rectifier bridge (2) and the output of the filter stage (5), the second input of the filter stage (5) being connected to the negative DC output (−) of the rectifier bridge (2) and the first input of the filter stage (5) being connected to the output of the amplifier stage (6); and wherein the filter stage (5) comprises a capacitor (C), a fall-control resistor (R1) and a rise-control resistor (R2) for controlling fall and rise characteristics respectively, and a switch (K) each having first and second connection terminals and further comprises a Zener-diode (Z) having anode and cathode terminals, the first connection terminal of the capacitor (C) and the anode of the Zener-diode (Z) being connected in parallel to the first input of the rectifier bridge (2) and the second connection terminal of the capacitor (C) and the cathode of the Zener-diode (Z) each being connected to the first connection terminals of the fall-control resistor (R1) and the rise-control resistor (R2), the second connection terminal of the fall-control resistor (R1) being connected to the first connection terminal of the switch (K), the second connection terminal of the switch (K) being the second output of the filter stage (5) and the first connection terminal of the rise-control resistor (R2) being the first output of the filter stage (5).

2. A switch with controlled rise and fall characteristics for electronic switching and power controlling of a load (L) the switch comprising:

a triac or an SCR switching element (Tk) having a first power electrode for connection in series with a load (L), having a second power electrode and having a gate electrode;

a rectifier bridge (2) having a first AC input connected to the first power electrode of the switching element (Tk), having a second AC input and having positive and negative DC outputs (+, −);

a filter circuit (1) connecting the second AC input of the rectifier bridge (2) to the gate electrode of the switching element (Tk);

a feed-back amplifier stage (6) having an output;

a low-power SCR (Ti) having first and second electrodes respectively connected to the positive and negative DC outputs (+,−) of the rectifier bridge (2) and having a gate electrode; and a diac (Dk) connected between the output of the feed-back amplifier stage (6) and the gate electrode of the low-power SCR (Ti);

wherein the feedback amplifier stage (6) comprises a phase shifting circuit (3) having first and second inputs and an output, a switching and/or amplifying circuit (4) having first and second inputs and an output and a filter stage (5) having first and second inputs and an output, the first and second inputs of the phase shifting circuit (3) being respectively connected to the positive and negative DC outputs (+,−) of the rectifier bridge (2), the outputs of the phase shifting circuit (3) and the switching and/or amplifying circuit (4) being connected as the output of the amplifier stage (6), the second and first inputs of the switching and/or amplifying circuit (4) being respectively connected to the negative DC output (−) of the rectifier bridge (2) and the output of the filter stage (5), the second input of the filter stage (5) being connected to the negative DC output (−) of the rectifier bridge (2) and the first input of the filter stage (5) being connected to the output of the amplifier stage (6); and wherein the filter stage (5) comprises a capacitor (C) having first and second connection terminals, a fall-control resistor (R1) and a rise-control resistor (R2) for controlling fall and rise characteristics respectively and each having first and second connection terminals, and further comprises a Zener- diode (Z) having anode and cathode terminals, a power control potentiometer (P) and a switch (K) each having first and second connection terminals and the power control potentiometer (P) having a middle control connection terminal, the second connection terminals of the capacitor (C) and the switch (K) and the anode of the Zener-diode (Z) being connected to the negative DC output (−) of the rectifier bridge (2), the first connection terminal of the switch (K) being connected to the second connection terminal of the power control potentiometer (P), the middle control connection terminal of the power control potentiometer (P) being connected to the first connection terminals of the capacitor (C) and the rise-control resistor (R2), the second connection terminal of the rise-control resistor (R2) being the output of the filter stage (5), the first connection terminal of the power control potentiometer (P) and the cathode of the Zener-diode (Z) being connected to the first connection terminal of the fall-control resistor (R1), and the second connection terminal of the fall-control resistor (R1) being the first input of the filter stage (5).

* * * * *